US005488236A

United States Patent [19]
Baliga et al.

[11] Patent Number: 5,488,236
[45] Date of Patent: Jan. 30, 1996

[54] LATCH-UP RESISTANT BIPOLAR TRANSISTOR WITH TRENCH IGFET AND BURIED COLLECTOR

[75] Inventors: B. Jayant Baliga, Raleigh, N.C.; Jacek Korec, Mörfelden-Walldorf, Germany

[73] Assignee: North Carolina State University, Raleigh, N.C.

[21] Appl. No.: 249,449

[22] Filed: May 26, 1994

[51] Int. Cl.⁶ .......................... H01L 29/74; H01L 31/111
[52] U.S. Cl. ..................... 257/132; 257/133; 257/137; 257/138; 257/331; 257/332; 257/334; 257/378
[58] Field of Search .................................. 257/132, 133, 257/137, 138, 331, 332, 334, 577, 378

[56] References Cited

U.S. PATENT DOCUMENTS

| | | |
|---|---|---|
| 4,443,931 | 4/1984 | Baliga et al. . |
| 4,587,712 | 5/1986 | Baliga . |
| 4,791,462 | 12/1988 | Blanchard et al. ........................ 357/23.4 |
| 4,835,586 | 5/1989 | Cogan et al. . |
| 4,903,189 | 2/1990 | Ngo et al. . |
| 4,928,155 | 5/1990 | Nakagawa et al. . |
| 4,982,260 | 1/1991 | Chang et al. ................................ 357/38 |
| 5,014,102 | 5/1991 | Adler . |
| 5,023,196 | 6/1991 | Johnsen et al. . |
| 5,032,888 | 7/1991 | Seki . |
| 5,086,323 | 2/1992 | Nakagawa et al. . |
| 5,089,864 | 2/1992 | Sakurai . |
| 5,093,701 | 3/1992 | Nakagawa et al. . |
| 5,105,244 | 4/1992 | Bauer . |
| 5,155,569 | 10/1992 | Terashima . |
| 5,164,325 | 11/1992 | Cogan et al. . |
| 5,168,331 | 12/1992 | Yilmaz . |
| 5,233,215 | 8/1993 | Baliga ........................................ 257/490 |
| 5,357,125 | 10/1994 | Inmagi ....................................... 257/136 |

FOREIGN PATENT DOCUMENTS

| | | |
|---|---|---|
| 0380340A2 | 8/1990 | European Pat. Off. . |
| 0506450A2 | 9/1992 | European Pat. Off. . |
| 3727019A1 | 2/1988 | Germany . |
| 61-285770A | 12/1986 | Japan . |
| 62-198160A | 9/1987 | Japan . |
| 63-55976A | 3/1988 | Japan . |
| 63-296282A | 12/1988 | Japan . |
| 2239561A | 7/1991 | United Kingdom . |

OTHER PUBLICATIONS

Baliga et al., "*The Insulated Gate Rectifier (IGR): A New Power Switching Device*", International Electron Device Meeting, (1982) Abstract No. 10.6, pp. 264–266.

Yilmaz et al., "*Insulated Gate Transistor Physics: Modeling and Optimization of the On–State Characteristics,*" IEEE Transactions on Electron Devices, vol. ED–32, No. 12, Dec. 1985, pp. 2812–2818.

Baliga et al., "*The MOS Depletion–Mode Thyristor: A New MOS–Controlled Bipolar Power Device,*" IEEE Electron Device Letters, vol. 9, No. 8, Aug. 1988, pp. 411–413.

Ueda et al., "*Deep–Trench Power MOSFET with an Ron Area Product of 160 mΩ–mm*", International Electron Device Meeting (1986), Abstract 28.2, pp. 638–641.

(List continued on next page.)

Primary Examiner—NgâV. Ngô
Attorney, Agent, or Firm—Bell, Seltzer, Park & Gibson

[57] ABSTRACT

A gate-controlled bipolar transistor with buried collector includes a wide base bipolar transistor in a semiconductor substrate having a trench at a face thereof. A dual-channel insulated-gate field effect transistor (IGFET) is also included adjacent a sidewall of the trench for providing gated turn-on and turn-off control of the bipolar transistor. The bipolar transistor includes a buried collector region at a bottom of the trench, which is electrically connected to a cathode contact at the face. An emitter of the transistor is electrically connected to an anode contact at an opposing face of the substrate. For turn-on, the base of the bipolar transistor is electrically connected to the cathode contact upon the application of a gate bias signal to the IGFET. By electrically connecting the base to the cathode contact, forward conduction can be established once the anode contact is appropriately biased relative to the cathode contact. Latch-up can also be prevented by using the buried collector region as a diverter region to prevent the regenerative conduction between P—N—P—N coupled regions of the transistor.

19 Claims, 8 Drawing Sheets

OTHER PUBLICATIONS

Chang et al., *Comparison of N and P Channel IGTs*, International Electron Device Meeting (1984), Abstract 10.6, pp. 278–281.

Baliga, *Modern Power Devices*, Chapters 6 and 7, pp. 263–406.

Ueda et al., *An Ultra–Low On–Resistance Power MOSFET Fabricated by Using a Fully Self–Aligned Process*, IEEE Transactions on Electron Devices, vol. ED–34, No. 4, Apr. 1987, pp. 926–930.

Chang, *Numerical and Experimental Comparison of 60V Vertical Double–Diffused MOSFETS and MOSFETS with a Trench–Gate Structure*, Solid–State Electronics, vol. 32, No. 3, 1989, pp. 247–251.

Bulucea et al., *Trench DMOS Transistor Technology for High–Current (100A Range) Switching*, Solid–State Electronics, vol. 34, No. 5, 1991, pp. 493–507.

Syau, et al., *Extended Trench–Gate Power UMOSFET Structure with Ultralow Specific On–Resistance*, Electronics Letters, vol. 28, No. 9, Apr. 1992, pp. 865–867.

Baliga, et al., *The Insulated Gate Transistor: A New Three–Terminal MOS–Controlled Bipolar Power Device, 1 IEEE Transactions on Electron Devices, vol. ED–31, No. 6, Jun. 1984, pp. 821–828.*

Russell et al., *The COMFET–A New High Conductance MOS–Gated Device*, IEEE Electron Device Letters, vol. EDL–4, No. 3, Mar. 1983, pp. 63–65.

Goodman et al., *Improved COMFETs with Fast Switching Speed and High–Current Capability*, International Electron Device Meeting (1983) Abstract No. 4.3, pp. 79–82.

Nakagawa et al., *Non–Latch–Up 1200V 75A Bipolar–Mode MOSFET with Large ASO*, International Electron Device Meeting (1984) Abstract No. 16.8, pp. 860–861.

Neudeck et al., *High Voltage 6H–SiC Rectifiers: Prospects and Progress*, IEEE Transactions on Electron Devices, vol. 40, No. 11, Nov. 1993, p. .

LATCH-UP RESISTANT BIPOLAR TRANSISTOR WITH TRENCH IGFET AND BURIED COLLECTOR

CROSS REFERENCE TO RELATED APPLICATIONS

This application is related to application Ser. No. 08/249,898, entitled DUAL-CHANNEL EMITTER SWITCHED THYRISTOR WITH TRENCH GATE (Attorney Docket No. 5051-241), filed concurrently herewith, the disclosure of which is hereby incorporated herein by reference.

FIELD OF THE INVENTION

The present invention relates to semiconductor switching devices, and more particularly to transistors with gated turn-on and turn-off control.

BACKGROUND OF THE INVENTION

The silicon bipolar transistor has been the device of choice for high power applications in motor drive circuits, appliance controls, robotics and lighting ballasts. This is because bipolar transistors can be designed to handle relatively large current densities in the range of 40–50 A/cm$^2$ and support relatively high blocking voltages in the range of 500–1000 V.

Despite the attractive power ratings achieved by bipolar transistors, there exist several fundamental drawbacks to their suitability for all high power applications. First of all, bipolar transistors are current controlled devices which require relatively large base currents, typically one fifth to one tenth of the collector current, to maintain the transistor in an operating mode. Proportionally larger base currents can be expected for applications which also require high speed turn-off. Because of the large base current demands, the base drive circuitry for controlling turn-on and turn-off is relatively complex and expensive. Bipolar transistors are also vulnerable to premature breakdown if a high current and high voltage are simultaneously applied to the device, as commonly required in inductive power circuit applications. Furthermore, it is relatively difficult to operate bipolar transistors in parallel because current diversion to a single transistor typically occurs at high temperatures, making emitter ballasting schemes necessary.

The silicon power MOSFET was developed to address this base drive problem. In a power MOSFET, the gate electrode provides turn-on and turn-off control upon the application of an appropriate gate bias. For example, turn-on in an N-type enhancement MOSFET occurs when a conductive N-type inversion layer is formed in the P-type channel region in response to the application of a positive gate bias. The inversion layer electrically connects the N-type source and drain regions and allows for majority carrier conduction therebetween.

The power MOSFET's gate electrode is separated from the channel region by an intervening insulating layer, typically silicon dioxide. Because the gate is insulated from the channel region, little if any gate current is required to maintain the MOSFET in a conductive state or to switch the MOSFET from an on-state to an off-state or vice-versa. The gate current is kept small during switching because the gate forms a capacitor with the MOSFET's channel region. Thus, only charging and discharging current ("displacement current") is required during switching. Because of the high input impedance associated with the insulated-gate electrode, minimal current demands are placed on the gate and the gate drive circuitry can be easily implemented.

Moreover, because current conduction in the MOSFET occurs through majority carrier transport only, the delay associated with the recombination of excess minority carriers is not present. Accordingly, the switching speed of power MOSFETs can be made orders of magnitude faster than that of bipolar transistors. Unlike bipolar transistors, power MOSFETs can be designed to withstand high current densities and the application of high voltages for relatively long durations, without encountering the destructive failure mechanism known as "second breakdown". Power MOSFETs can also easily be paralleled, because the forward voltage drop of power MOSFETs increases with increasing temperature, thereby promoting an even current distribution in parallel connected devices.

In view of these desirable characteristics, many variations of power MOSFETs have been designed. Two popular types are the double-diffused MOS (DMOS) device and the ultra-low on-resistance MOS device (UMOS). The DMOS structure and its operation and fabrication are described in the textbook by coinventor Baliga entitled *Modern Power Devices*, the disclosure of which is hereby incorporated herein by reference. Chapter 6 of this textbook describes power MOSFETs at pages 263–343. FIG. 1 herein is a reproduction of FIG. 6.1(a) from the above cited textbook, and illustrates a cross-sectional view of a basic DMOS structure. The DMOS structure is fabricated using planar diffusion technology.

The UMOS device, also referred to as a "Trench DMOS" device, is described in publications entitled: *An Ultra-Low On-Resistance Power MOSFET Fabricated by Using a Fully Self-Aligned Process*, by Ueda et al., IEEE Transactions on Electron Devices, Vol. ED34, No. 4, April (1987), pp. 926–930; *Numerical and Experimental Comparison of 60V Vertical Double-Diffused MOSFETS and MOSFETS with a Trench-Gate Structure* by Chang, Solid State Electronics, Vol. 32, No. 3, pp. 247–251 (1989); *Trench DMOS Transistor Technology for High-Current (100A Range) Switching* by Bulucea et al., Solid State Electronics, Vol. 34, No. 5, pp. 493–507 (1991); and *Extended Trench-Gate Power UMOSFET Structure with Ultralow Specific On-Resistance*, by Syau et al., Electronics Letters, Vol. 28, No. 9, pp. 865–867 (1992). FIG. 2 herein is a reproduction of a portion of FIG. 1 of the above identified Ueda et al. publication illustrating an embodiment of the UMOS structure.

A third example of a silicon power MOSFET is shown in FIG. 3. FIG. 3 is a reproduction of FIG. 4 from U.S. Pat. No. 4,903,189 to Ngo et al. and coinventor Baliga, the disclosure of which is hereby incorporated herein by reference. This MOSFET 170, which includes trenches 178 at a face thereof and contains no P—N junctions, is commonly referred to as an accumulation-mode FET ("ACCU-FET") because turn-on is achieved by forming a conductive accumulation layer between the FET's source 186 and drain 182 regions. FIG. 3 shows a plurality of parallel connected ACCU-FET cells, each defined by mesas 179 and opposing trenches 178.

A fourth example of a vertical power MOSFET is shown in FIG. 4A. FIG. 4A is a reproduction of FIG. 3 from U.S. Pat. No. 5,168,331 to H. Yilmaz. In particular, this MOSFET includes a "free floating" shield region 30 (P or N—) which serves as a buffer to reduce the strength of the electric field at point 18, which is adjacent to a corner in the profile of the gate 12.

The above-described beneficial characteristics of power MOSFETs are typically offset, however, by the relatively high on-resistance of the MOSFET's channel region, which arises from the absence of minority carrier injection. As a result, a MOSFET's operating forward current density is typically limited to relatively low values, typically in the range of 10 A/cm$^2$, for a 600 V device, as compared to 40–50 A/cm$^2$ for the bipolar transistor.

On the basis of these features of power bipolar transistors and MOSFET devices, hybrid devices embodying a combination of bipolar current conduction with MOS-controlled current flow were developed and found to provide significant advantages over single technologies such as bipolar or MOSFET alone. One example of a hybrid device is the Insulated Gate Bipolar Transistor (IGBT), disclosed in section 7.2 of the aforementioned Baliga textbook.

The IGBT combines the high impedance gate of the power MOSFET with the small on-state conduction losses of the power bipolar transistor. An added feature of the IGBT is its ability to block both forward and reverse bias voltages. Because of these features, the IGBT has been used extensively in inductive switching circuits, such as those required for motor control applications. These applications require devices having wide forward-biased safe-operating-area (FBSOA) and wide reverse-biased safe-operating-area (RBSOA).

One embodiment of an IGBT is disclosed in an article by coinventor B. J. Baliga and M. S. Adler, R. P. Love, P. V. Gray and N. Zommer, entitled *The Insulated Gate Transistor: A New Three terminal MOS Controlled Bipolar Power Device,* IEEE Trans. Electron Devices, ED-31, pp. 821–828 (1984), the disclosure of which is hereby incorporated herein by reference. Based on experimental results, on-state losses were shown to be greatly reduced when compared to power MOSFETs. This was caused by the conductivity modulation of the IGBT's drift region during the on-state. Moreover, very high conduction current densities in the range of 200–300 A/cm$^2$ were also achieved. Accordingly, an IGBT can be expected to have a conduction current density approximately 20 times that of a power MOSFET and five (5) times that of an equivalent bipolar transistor. Typical turn-off times for the IGBT can be in the range of 10–50 μs.

The basic structure of the IGBT is shown in cross-section in FIG. 5A, which is a reproduction of FIG. 1 from the aforementioned Baliga et al. article. In the IGBT, forward conduction can occur by positively biasing the anode (or electron "collector") with respect to the cathode (or electron "emitter") and applying a positive gate bias of sufficient magnitude to invert the surface of the P-base region under the gate. By creating an inversion layer in the P-base region, electrons are allowed to flow from the N+ emitter region to the N-base region. In this forward conducting state, the junction J2 is forward biased and the P+ anode region injects holes into the N-Base region. As the anode bias is increased, the injected hole concentration increases until it exceeds the background doping level of the N-base. In this regime of operation, the device operates like a forward-biased P—i—N diode with heavy conductivity modulation of the N-base region. In the reverse bias region, the anode is biased negative with respect to the cathode and the lower junction (J3) is reversed biased, thereby preventing conduction from the cathode to anode even though the upper junction (J2) is forward biased. This provides the device with its reverse blocking capability.

Another IGBT which includes a "free floating" shield region for improving the reverse blocking capability is shown in FIG. 4B, which is a reproduction of FIG. 10 from the aforementioned '331 patent to Yilmaz. In particular, this IGBT includes a "free floating" shield region 85 (P or N—) which serves as a buffer to reduce the strength of the electric field at point 87, which is adjacent to a corner in the profile of the gate 82.

The IGBT can typically operate at high current densities even when designed for operation at high blocking voltages. As long as the gate bias is sufficiently large to produce enough inversion layer charge for providing electrons into the N-base region, the IGBT forward conduction characteristics will look like those of a P—i—N diode. However, if the inversion layer conductivity is low, a significant voltage drop will begin to appear across this region like that observed in conventional MOSFETs. At this point, the forward current will saturate and the device will operate in its active or current saturation region, as shown in FIG. 5B, which is a reproduction of FIG. 2 from the aforementioned Baliga et al. article. As will be understood by those skilled in the art, high voltage current saturation is ultimately limited by avalanche induced breakdown. Finally, because the elimination of the inversion layer cuts off the supply of electrons into the N-base region and because there is no self-sustaining source of electrons to the N-base region, the IGBT will typically turn off even if the anode remains positively biased.

One significant drawback to the operation of IGBTs is the presence of a parasitic P—N—P—N structure between the anode and cathode which can cause a loss in the gate controlled turn-off capability by becoming regenerative at high current densities. The current level at which parasitic thyristor latch-up occurs provides a limit to FBSOA at low anode voltages, while at high anode voltages, FBSOA is limited by dynamic avalanche breakdown.

As will be understood by one skilled in the art, latch-up can be prevented so long as the sum of the current gains of the regeneratively coupled P—N—P and N—P—N transistors ($\alpha_{pnp}$, $\alpha_{npn}$) is less than unity. To inhibit the likelihood of latch-up operation, the current gain of the N—P—N transistor ($\alpha_{npn}$) can be made relatively small by reducing the P-base sheet resistance and/or the width of the N$^+$ source region. This suppresses electron injection from the N$^+$ source region to the P-base because the uppermost P—N junction between the P-base and N$^+$ source is effectively short circuited, thereby eliminating the regenerative P—N—P—N path from between the anode and cathode.

However, as described in an article by J. P. Russell, A. M. Goodman, L. A. Goodman and J. M. Neilson, entitled *The COMFET-A New High Conductance MOS-Gated Device,* IEEE Electron Device Letters, Vol. EDL-4, No. 3, March (1983), pp. 63–65, even devices having a relatively low P-base sheet resistance can be susceptible to regenerative latch-up if sufficiently large forward current densities cause significant emitter injection into the base of the N—P—N transistor (P-base) and cause $\alpha_{npn}$ to increase. To reduce the likelihood of parasitic latch-up, the COMFET structure was modified to include a heavily doped P$^+$ region in the middle of the P-base region, electrically connected to the cathode contact.

Other attempts have also been made to reduce the IGBT's susceptibility to latch-up. For example, in an article by A. M. Goodman, J. P. Russell, L. A. Goodman, C. J. Nuese and J. M. Neilson, entitled *Improved COMFETs with Fast Switching Speed and High-Current Capability,* IEEE International Electron Devices Meeting Digest, Abstract 4.3, (1983), pp. 79–82, a highly doped (N$^+$) epitaxial layer was formed on top of the P$^+$ anode region at junction J3 in order to lower the gain of the lower P—N—P transistor ($\alpha_{pnp}$) and thereby reduce the likelihood of parasitic latch-up at high current densities.

A hole-bypass technique involving the elimination of one of the two uppermost N-type emitter regions from the uppermost P-base region is also described in an article by A. Nakagawa, H. Ohashi, M. Kurata, H. Yamaguchi and K. Watanabe, entitled *Non-Latch-Up 1200 v 75 A Bipolar-Mode MOSFET with Large ASO* IEEE International Electron Devices Meeting Digest, Abstract 16.8, (1984), pp. 860–861. By eliminating the emitter region on one side of the P-base, the hole current collected by the base on that side is provided to the cathode contact without having to travel around an $N^+$ emitter region. This bypass technique reduces the likelihood that the uppermost P—N junction between the P-base and $N^+$ emitter will become forward biased at high current densities.

Another attempt to reduce the IGBT's susceptibility to latch-up is disclosed in a copending patent application Ser. No. 07/990,062, filed Dec. 14, 1992, entitled *Insulated Gate Bipolar Transistor With Reduced Susceptibility to Parasitic Latch-Up*, by coinventor Baliga, the disclosure of which is hereby incorporated herein by reference. In this IGBT, injection suppressing means is provided between the N+ emitter and P-base region to prevent minority carrier injection from the N+ emitter to the P-base when the anode is biased positive relative to the cathode. Injection suppressing means preferably includes an electrical insulator such as $SiO_2$.

Notwithstanding these attempts to develop improved IGBTs for high power applications, there still exists a need to develop a semiconductor switching device which has low on-state resistance and high reverse blocking voltage capability. There also exists a need for a switching device which has wide forward and reverse safe-operating-area (SOA) and has reduced susceptibility to regenerative parasitic latch-up. Finally, there also exists a need for a switching device which can be easily fabricated with a relatively small number of processing steps.

SUMMARY OF THE INVENTION

It is therefore an object of the present invention to provide a semiconductor switching device which is capable of handling high forward current densities with low on-state voltage drop and has low gate drive power requirements.

It is another object of the present invention to provide a semiconductor switching device which has reduced susceptibility to parasitic latch-up and has high reverse blocking capability.

It is still another object of the present invention to provide a semiconductor switching device which has a wide forward-biased safe-operating-area (FBSOA) and wide reverse-biased safe-operating-area (RBSOA).

These and other objects are provided, according to the present invention, by a semiconductor switching device which has a three-terminal non-regenerative device therein, extending between first and second opposing faces of a semiconductor substrate. Anode and cathode contacts (or terminals) are provided on the first and second faces, respectively. Means, responsive to a bias signal at a third terminal, is also provided for electrically connecting a "floating" portion of the non-regenerative device to the cathode contact, to initiate turn-on of the switching device.

Implementation of the preferred electrical connecting means typically causes the formation of a parasitic regenerative device in the substrate. Under normal operating conditions, this regenerative device may provide a self-sustaining latch-up current between the anode and cathode contacts and reduce the FBSOA of the switching device. More significantly, sustained latch-up can cause permanent device failure if the latch-up current is not turned-off. Accordingly, the below described embodiments of the present invention include features to inhibit the occurrence of latch-up and also turn off the regenerative device if it becomes latched.

To achieve these objects and advantages, a first embodiment of the present invention includes a trench at the second face of the substrate and a non-regenerative device, such as a transistor, between a bottom of the trench and the anode contact. The non-regenerative device can be a P—N—P or an N—P—N bipolar transistor, for example, which has a floating base of first conductivity type (N or P-type) in the substrate. For the case of a bipolar transistor, an emitter of second conductivity type (P or N-type) and a buried collector of second conductivity type are included in the substrate. The emitter is electrically connected to the anode contact at the first face; and the buried collector extends adjacent the trench bottom and is also electrically connected to the cathode contact at the second face. The purpose of the buried collector is to "collect" minority carriers traversing the base region. These minority carriers, which are holes in a P—N—P or electrons in an N—P—N, are provided by the emitter.

Means, is also provided along a sidewall of the trench for electrically connecting the floating base to the cathode contact in response to a first bias signal. Electrical connecting means preferably includes an insulated-gate field effect transistor ("IGFET") having a conductive gate electrode in the trench and a gate insulating layer between the gate electrode and the trench sidewall. Accordingly, an appropriate bias at the gate electrode causes the formation of a conductive channel in the substrate, adjacent the trench sidewall. This conductive channel provides the necessary drive current to the base when the anode contact is biased to a first polarity relative to the cathode contact.

More particularly, a semiconductor switching device is provided in a substrate which has a first trench and a second adjacent trench at the second face. The switching device includes a non-regenerative device therein. The non-regenerative device has a second conductivity type region (buried collector) at a bottom of the first trench and a first conductivity type region (floating base) which forms a P—N junction therewith in the substrate.

Insulated-gate transistor means is also provided adjacent a sidewall of the first trench for controlling turn-on and turn-off of the non-regenerative device. In particular, insulated-gate transistor means performs the function of enabling turn-on of the non-regenerative device by electrically connecting its first conductivity type region to the cathode contact at the face. However, as noted above, implementation of an electrical connecting means, such as insulated-gate transistor means, can cause the formation of a regenerative device, which may latch-up when the switching device is operating at high forward current densities. The regenerative device will typically have first and second conductivity type regions, which extend between the trenches and are electrically connected to a cathode contact on the second face. The regenerative device may be a parasitic P—N—P—N thyristor.

Insulated-gate transistor means can also perform the function of inhibiting electrical conduction (e.g., latch-up) in the regenerative device by electrically connecting the second conductivity type regions of the regenerative and non-regenerative devices together. Accordingly, majority carriers in the second conductivity type region of the regenerative device may be swept away to the cathode contact via the non-regenerative device. This function is performed to prevent the forward biasing of a P—N junction which is formed by the first and second conductivity type regions of the regenerative device. The forward biasing of this junction can cause parasitic latch-up and reduce the FBSOA of the switching device. This is particularly true if the distance between the first and second adjacent trenches ($W_m$) is large relative to the width of the trenches ($W_t$) so that minority carriers traversing the first conductivity type region of the non-regenerative device are actually collected by the second conductivity type region of the regenerative device, instead of the second conductivity type region of the non-regenerative device.

According to a second embodiment of the present invention, a plurality of adjacent trenches of stripe or similar geometry can be provided in the substrate at the second face so that a plurality of adjacent non-regenerative devices ("switching cells") can be parallel connected to form a three-terminal high-current switching device.

According to a third embodiment of the present invention, the switching device includes a semiconductor substrate having anode and cathode contacts on first and second opposing faces thereof, respectively. An anode region is also provided in the substrate and ohmically contacts the anode contact. A first conductivity type region, a second conductivity type region and a cathode region are also provided between the anode region and the cathode contact. In particular, the first conductivity type region forms a first P—N junction with the anode region; and the second conductivity type region forms a second P—N junction with the first conductivity type region, at a position intermediate the first and second opposing faces. The second conductivity type region and cathode region also ohmically contact the cathode contact, and a third P—N junction is formed therebetween.

Further according to this embodiment, a buried collector region of second conductivity type is provided in the first conductivity type region, and forms a fourth P—N junction at a position intermediate the first face and the second P—N junction. The buried collector region also electrically contacts the cathode contact. Means is also provided adjacent the second conductivity type region for electrically connecting the cathode region to the first conductivity type region in response to a bias signal. Means may also be provided adjacent the first conductivity type region for electrically connecting the second conductivity type region to the buried collector region in response to a second bias signal. This electrical connection inhibits the likelihood of latch-up in a parasitic thyristor which is formed by the anode, first conductivity type, second conductivity type and cathode regions. Electrical connecting means preferably includes insulated-gate transistor means such as a IGFET or more particularly, a MOSFET.

According to a fourth embodiment of the present invention, the switching device includes a planar insulated-gate bipolar transistor having an anode region at a first face of a semiconductor substrate, a first base region of first conductivity type on the anode region, a base region of second conductivity type in the first base region and at least one cathode region of first conductivity type in the base region of second conductivity type. Both the cathode region and the base region of second conductivity type extend to the second face and ohmically contact a cathode contact thereon.

In addition, a relatively shallow collector/diverter region is also provided adjacent the base region of second conductivity type. The collector/diverter region ohmically contacts the cathode contact at the second face and acts as the collector of a wide-base bipolar transistor which includes the first base region and the anode region.

In addition, a "dual-channel" lateral MOSFET is provided at the second face and has a first channel region in the first base region and a second channel region in the base region of second conductivity type, between the cathode region and the first base region. The application of a first gate bias signal to the lateral MOSFET electrically connects the cathode region to the first base region by a first inversion layer channel to turn-on the device. The application of a second gate bias signal electrically connects the base region of second conductivity type to the shallow collector/diverter region by a second inversion layer channel to prevent latch-up of a parasitic thyristor formed by said anode region, said first base region, said base region of second conductivity type and said cathode region.

DESCRIPTION OF PREFERRED EMBODIMENTS

Figure 1:
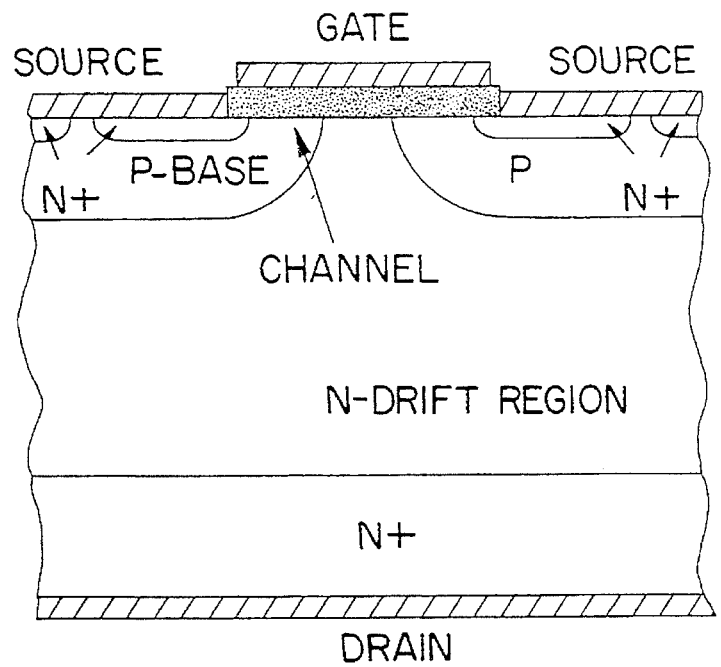
FIG. 1 is a cross-sectional illustration of a prior art silicon power DMOSFET.
Figure 2:
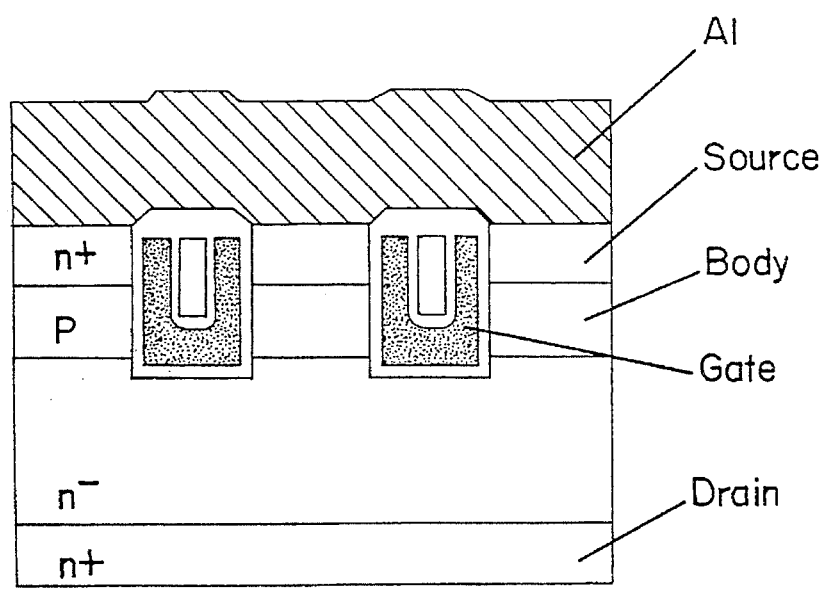
FIG. 2 is a cross-sectional illustration of a prior art silicon power UMOSFET.
Figure 3:
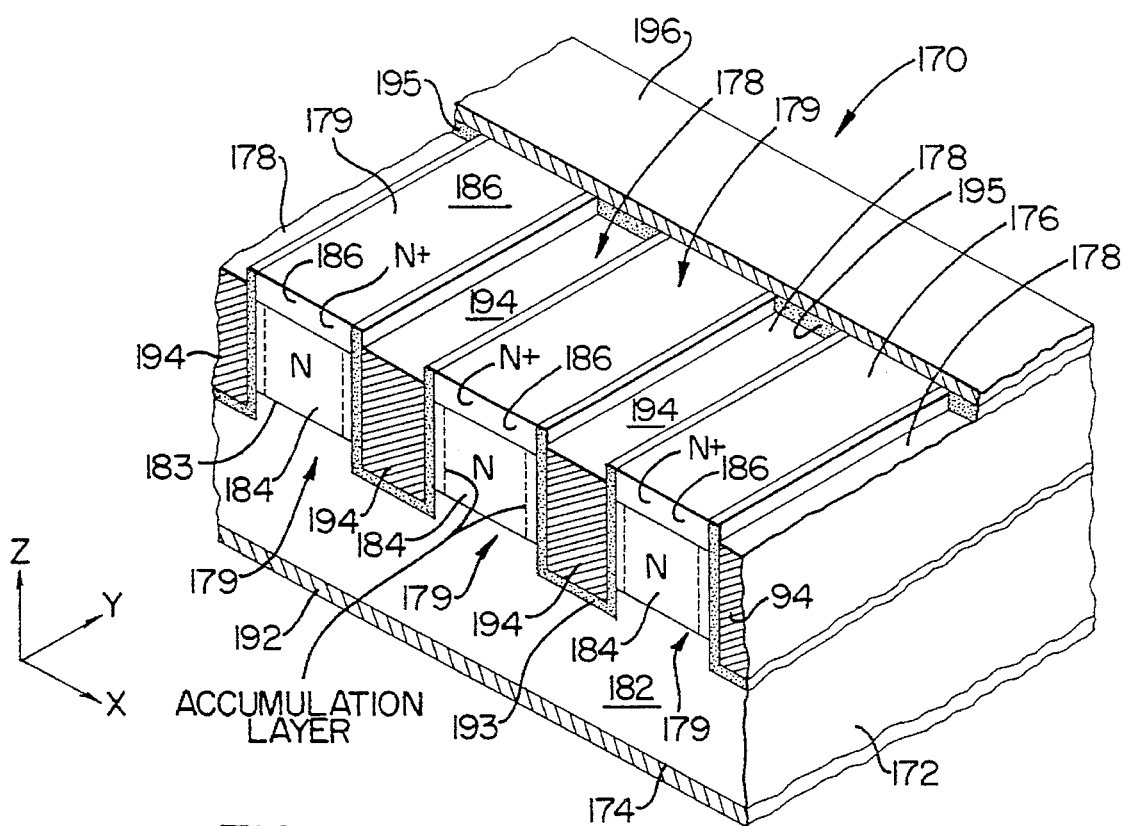
FIG. 3 is a cross-sectional illustration of a prior art silicon ACCUFET.
Figure 4A:
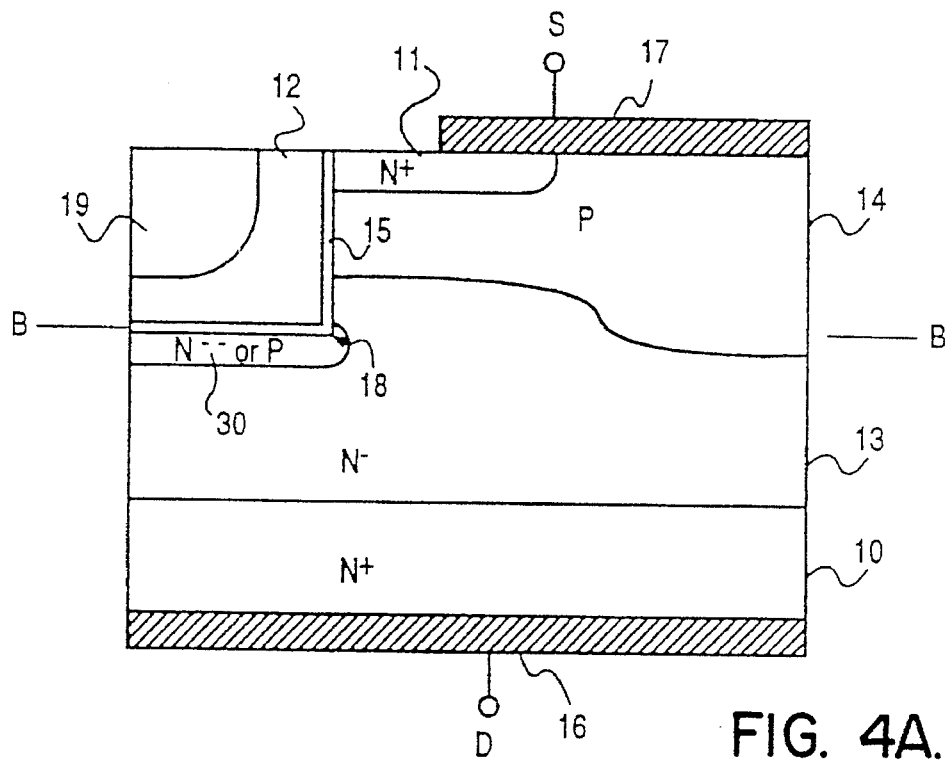
FIG. 4A is a cross-sectional illustration of a prior art high-power MOSFET.
Figure 4B:
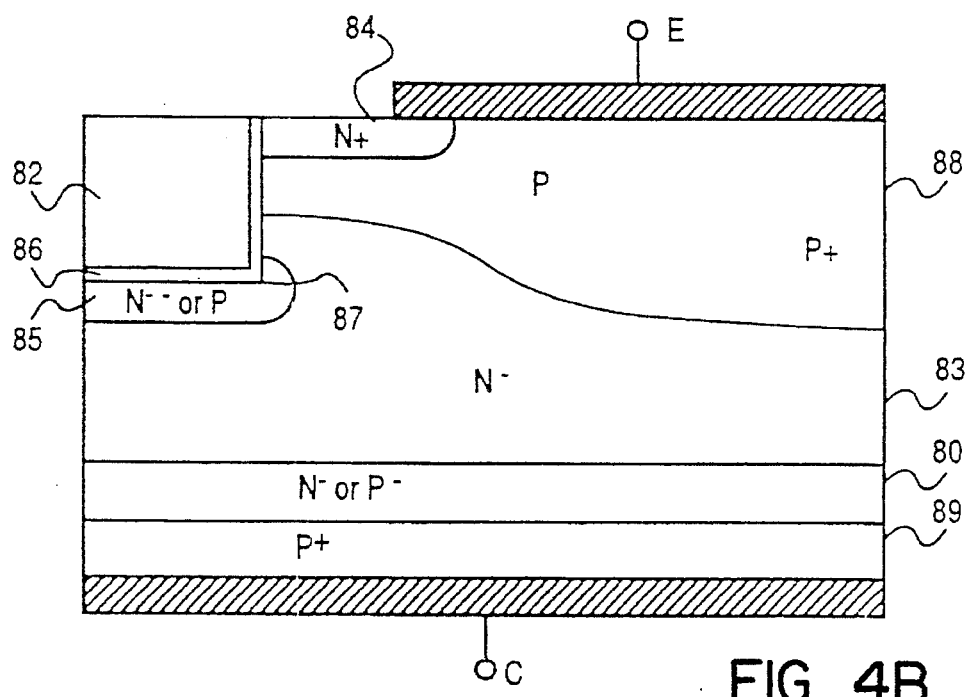
FIG. 4B is a cross-sectional illustration of a prior art IGBT.
Figure 5A:
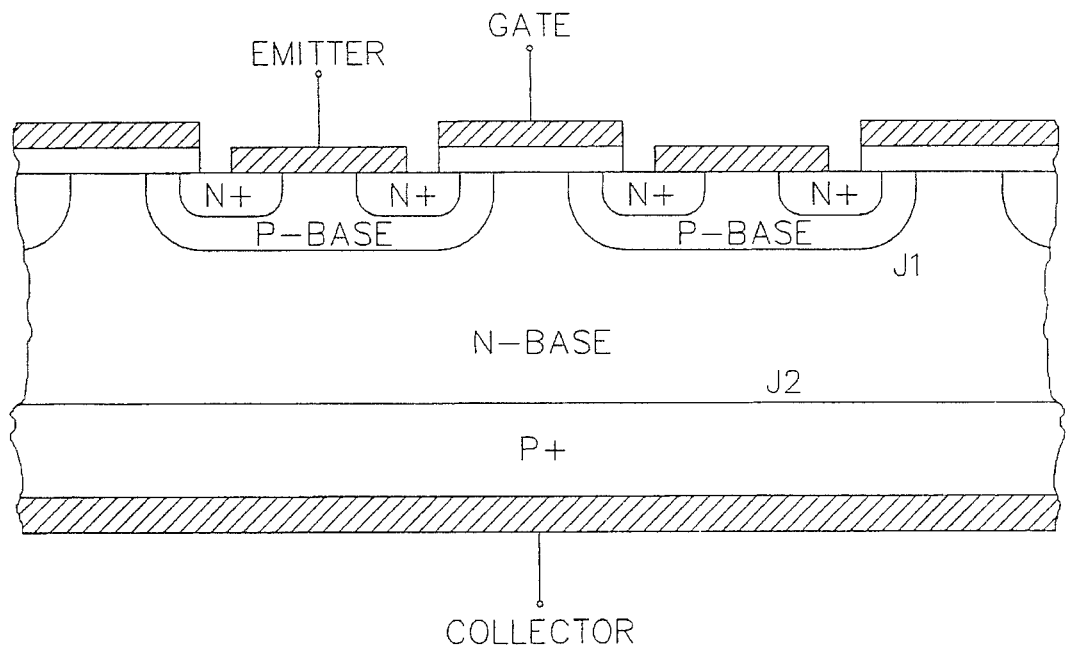
FIG. 5A is a cross-sectional illustration of a prior art IGBT.
Figure 5B:
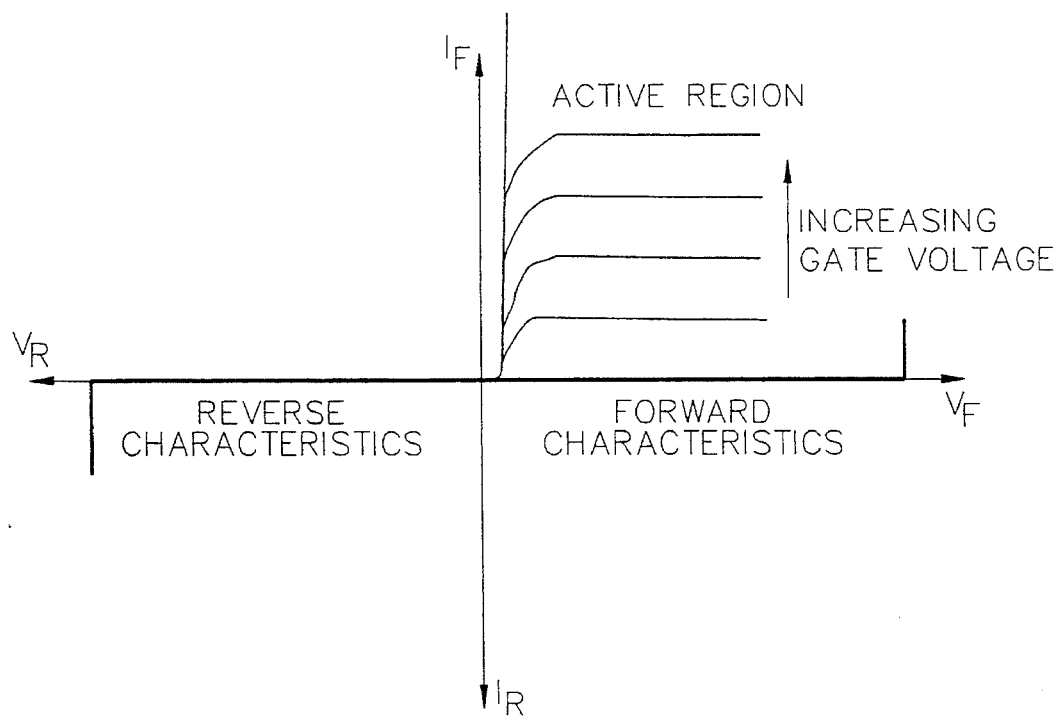
FIG. 5B is a simulated graph of current versus voltage for the IGBT of FIG. 5A, at various gate voltages.

The present invention will now be described more fully hereinafter with reference to the accompanying drawings, in which preferred embodiments of the invention are shown. This invention may, however, be embodied in different forms and should not be construed as limited to the embodiments set forth herein. Rather, these embodiments are provided so that this disclosure will be thorough and complete, and will fully convey the scope of the invention to those skilled in the art. In the drawings, the thickness of layers and regions are exaggerated for clarity. Like numbers refer to like elements throughout. Moreover, the terms "first conductivity type" and "second conductivity type" refer to opposite conductivity types such as N or P-type, however, each embodiment described and illustrated herein includes its complementary embodiment as well.

Figure 6:
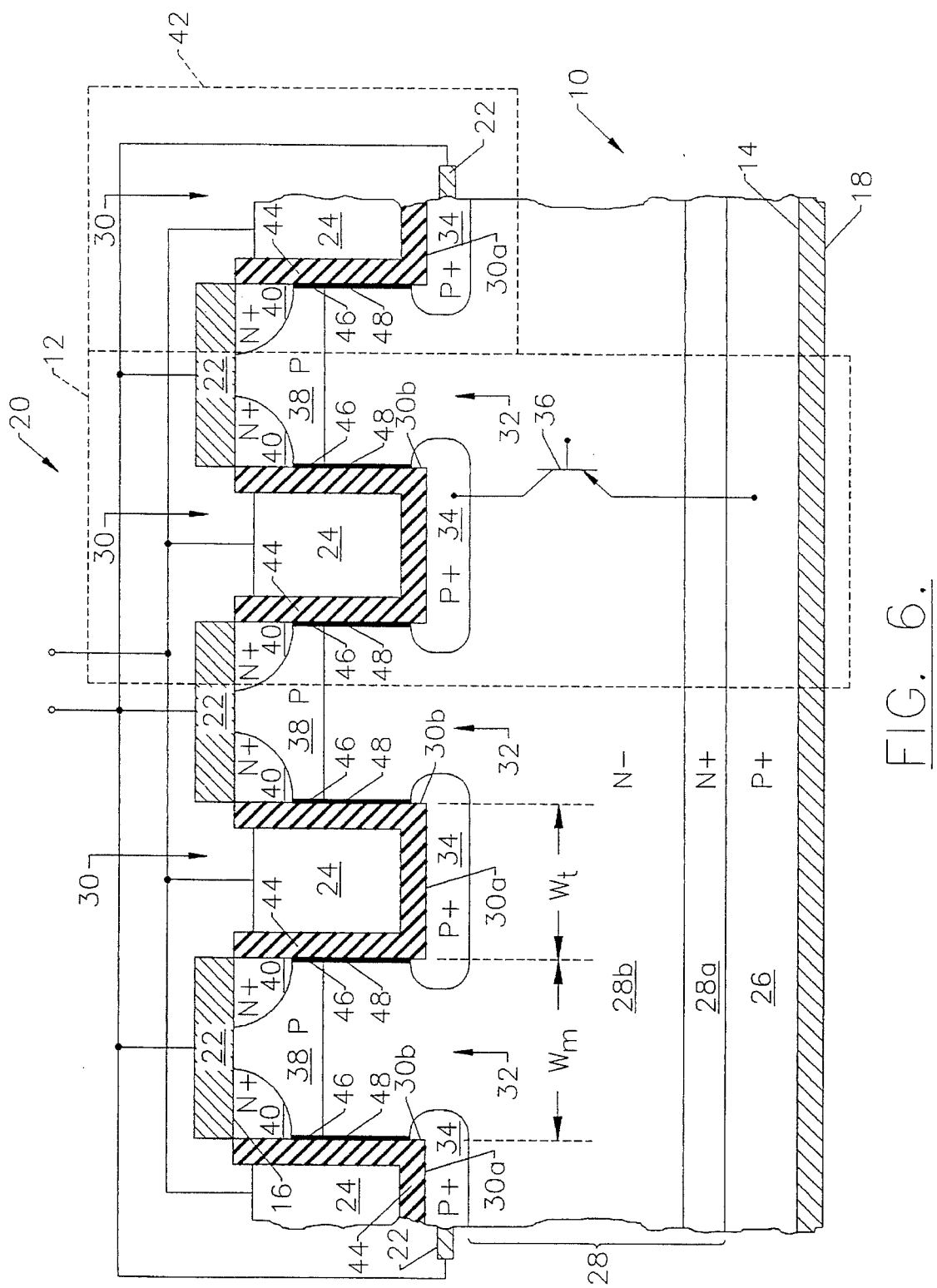
FIG. 6 is a cross-section illustration of a semiconductor switching device according to a first embodiment of the present invention.

Referring now to FIG. 6, a semiconductor substrate 10 having a plurality of switching cells 12, according to one embodiment of the present invention, is illustrated. Each switching cell 12 is preferably parallel-connected to another cell in the substrate 10, between first and second opposing faces 14 and 16, respectively. By connecting individual cells 12 in parallel, a three-terminal high-current switching device 20 can be achieved having a common anode contact 18 and cathode contact 22, and common gate electrodes 24 (e.g., poly-silicon, metal, etc.).

In particular, the switching device 20 includes an anode region 26 of second conductivity type (shown as P-type) in the substrate 10, adjacent the first face 14. The device 20 further includes a first base region 28 of first conductivity type (shown as N-type) on the anode region 26 and forming a P—N junction therewith. As illustrated, the first base region 28 preferably includes a relatively highly doped buffer region 28a, and a relatively lightly doped drift region 28b which is capable of supporting high voltages between the anode contact 18 and the cathode contact 22. In addition, a plurality of trenches 30 (i.e., grooves) are preferably formed in side by side relation in the substrate 10, at the second face 16. These trenches 30 preferably have bottoms 30a and vertical or inclined sidewalls 30b. Accordingly, mesas 32 are defined in the substrate 10, between sidewalls of adjacent trenches. As will be understood by those skilled in the art, the trenches 30 can be of stripe or similar geometry, extending in a third dimension, not shown.

The switching device 20 further includes buried collector regions 34 of second conductivity type in the first base region 28. The buried collector regions 34 are preferably formed by implanting second conductivity type dopants at the trench bottoms 30a. As shown schematically, the buried collector regions 34 are electrically connected to the cathode contact 22. Preferably, the electrical connections between the buried collector regions 34 and the cathode contact 22 are made in a third dimension along the length of the trenches 30, not shown. Accordingly, a non-regenerative device which is incapable of entering into a self-sustaining current mode of operation is electrically connected between the anode contact 18 and the cathode contact 22. This non-regenerative device is typically a bipolar transistor 36, as schematically illustrated.

As will be understood by those skilled in the art, the bipolar transistor 36 includes a floating base region (i.e., the first base region 28). Thus, turn-on of the P—N—P bipolar transistor 36 (as shown) can be initiated by electrically connecting the first base region 28 to the cathode contact 22 and simultaneously biasing the anode contact be positive relative to the cathode contact 22. When this occurs, minority carriers (holes) will typically traverse the first base region 28 and be collected by the buried collector regions 34.

Referring still to FIG. 6, the switching device 20 further includes second base regions 38 of second conductivity type. The second base regions 38 form P—N junctions with the drift region 28b, and extend to the second face 16. The second base regions 38 also facilitate gated turn-on and turn-off of the bipolar transistor 36, as described more fully below. Cathode regions 40 of first conductivity type are also provided in the second base region 38, at the second face 16.

To complete the device 20, means is also provided in the substrate 10, for electrically connecting the cathode region 40 to the first base region 28, in response to a bias signal. In particular, electrical connecting means preferably includes insulated gate transistor means 42 in the trenches 30. Insulated gate transistor means 42 can include one or a plurality of parallel-connected insulated-gate field effect transistors (IGFETs) having conductive gate electrodes 24, insulating layers 44 (e.g., oxide) and "channel" regions in the substrate 10. As used herein, a channel region (or active region) describes a region of the substrate 10 which can be modulated by the application of a gate bias to an external electrode. Accordingly, second base regions 38 and those portions of the drift region 28b which extend into the mesas 32, are respective P-type and N-type channel or active regions.

Thus, the cathode regions 40 can be electrically connected to the first base region 28 by applying a positive bias to the gate electrodes 24. This creates vertical N-type inversion layer channels 46 in the channel regions or second base regions 38. These inversion layer channels 46 extend adjacent respective sidewalls 30b of each trench, and provide the drive current to the first base region 28, which as shown schematically comprises the bases of a plurality of parallel-connected wide base P—N—P transistors 36.

The electrical connection between the cathode regions 40 and first base region 28 can also cause the second base regions 38 to act as collectors of minority carriers (e.g., holes) traversing the first base region 28. This is particularly true if the width of the mesas 32 ($W_m$) are relatively wide compared to the width of the trenches 30 ($W_t$) and the buried collector regions 34. As will be understood by those skilled in the art, the P—N junctions formed by respective second base regions 38 and cathode regions 40 may become forward biased at high forward current densities, if the second base region 38 receives a sufficient number of holes (or electrons in a complementary device). If this occurs, parasitic latch-up may also occur. The occurrence of latch-up limits the switching device's FBSOA and can possibly cause device failure if sustained.

Parasitic latch-up can occur if the regenerative device (e.g., thyristor) formed by the cathode region 40, the respective second base region 38, the first base region 28 and the anode region 26 is turned on. Latch-up will also be sustainable if the summation of the current gains ($\alpha_{npn}$, $\alpha_{pnp}$) of the regenerative device's cross-coupled N—P—N and P—N—P transistors exceeds unity. When this occurs, each transistor drives the other into saturation and provides the other with a self-sustaining (i.e., regenerative) supply of carriers to the respective transistor's base region (28 or 38). These N—P—N and wide base P—N—P transistors are formed by regions (40, 38, 28) and (26, 28, 38), respectively.

To prevent latch-up by inhibiting electrical conduction in the regenerative device formed by regions (26, 28, 38 and 40), insulated-gate transistor means 42 is constructed to perform the additional function of electrically connecting the second base regions 38 to the buried collector regions 34 in response to the application of a negative bias to the gate electrodes 24. This creates P-type inversion layer channels 48 in the portion of the drift region 28b which extends adjacent the trench sidewalls 30b. Therefore, if a significant percentage of holes traversing the first base region 28 are collected by the second base regions 38, insulated gate transistor means 42 can be biased to provide an electrical path for sweeping (or "diverting") a portion of the collected holes to the cathode contact 22, via the buried collector regions 34. This sweeping or diverting of holes from the second base regions 38 also improves the RBSOA of the device 20 when the device 20 is turned off with an inductive load. The buried collector regions 34, which extend adjacent the trench bottoms 30a and sidewalls 30b, also perform the function of limiting the electric field in the insulating layers 44, at the corners of the trenches 30. This serves to increase the FBSOA of the switching device 20.

Accordingly, gated turn-on and turn-off control of the bipolar transistors 36 formed by regions (26, 28 and 34) is preferably provided by a dual-channel vertical IGFET (e.g., MOSFET) having gate electrodes 24 and gate insulating layers 44, adjacent the trench sidewalls 30b. In particular, turn-on of the bipolar transistors 36 is initiated by applying a positive bias to the gate electrodes so that the drift region 28b becomes "tied" to the cathode contact 22. Turn-off of the transistors 36 occurs by removing the positive bias. In addition, if the parasitic regenerative devices formed by regions (26, 28, 38 and 40) become latched during forward conduction, sustained latch-up can be prevented by applying a negative bias to the gate electrodes 24 so that holes collected in the second base regions 38 can be swept to the buried collector regions 34 and to the cathode contact 22, thereby bypassing the P—N junction formed by regions 38 and 40.

Figure 7:
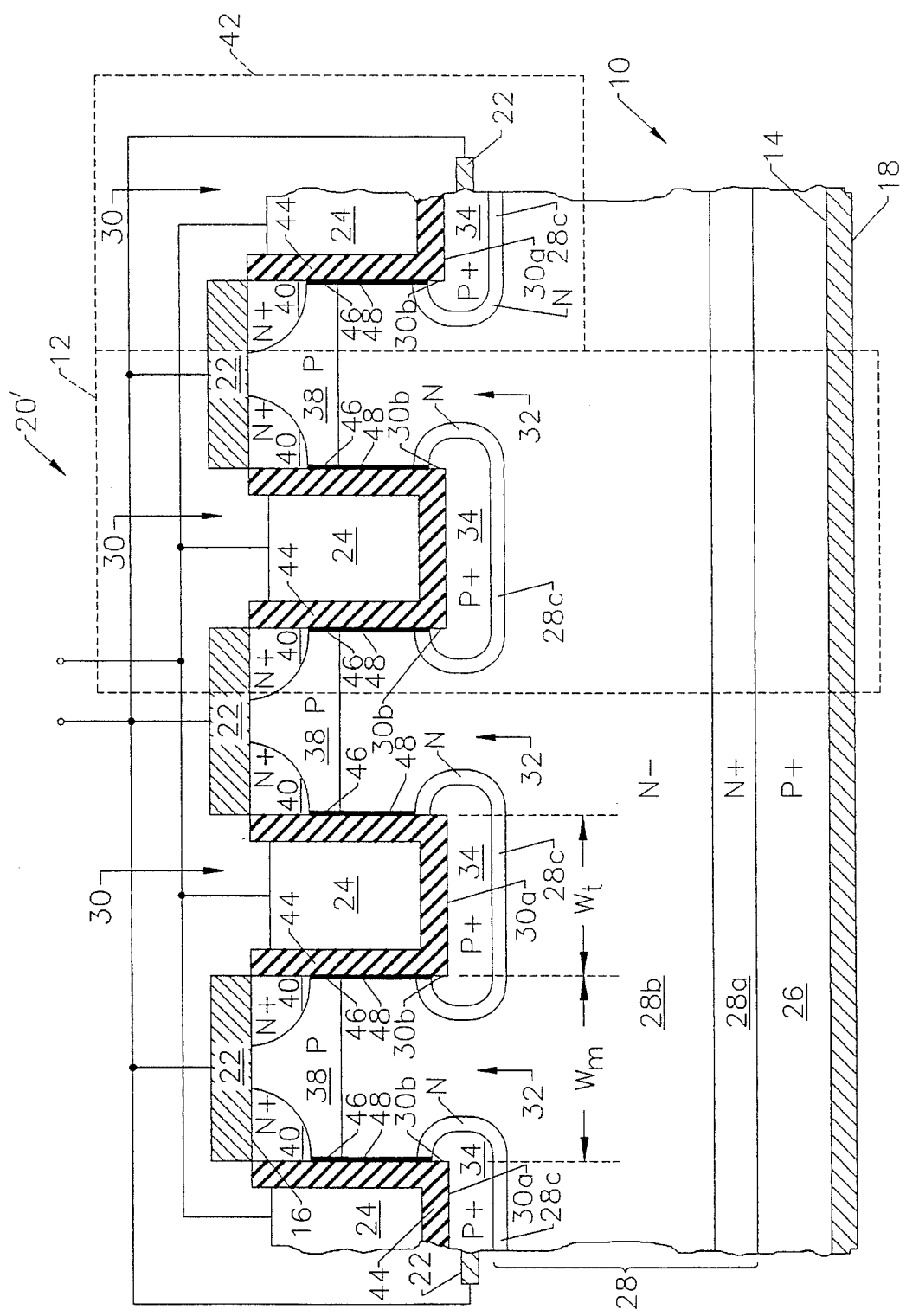
FIG. 7 is a cross-section illustration of a semiconductor switching device according to a second embodiment of the present invention.

Referring now to FIG. 7, a second embodiment of a switching device 20' according to the present invention is illustrated. The switching device 20' is similar to the switching device 20 of FIG. 6, however, pinch-off inhibiting regions 28c, having a doping concentration greater than that of the drift region 28b, are provided at respective trench bottoms 30a. The pinch-off inhibiting regions 28c are driven-in deeper than the buried collector regions 34 and therefore surround the buried collector regions 34, as illustrated. As will be understood by those skilled in the art, the pinch-off inhibiting regions 28c reduce the resistance of the drift region by limiting the JFET pinch-off effect ("necking") that occurs between the P-type regions 38 and 34, when the bipolar transistors 36 are turned on.

Figure 8:
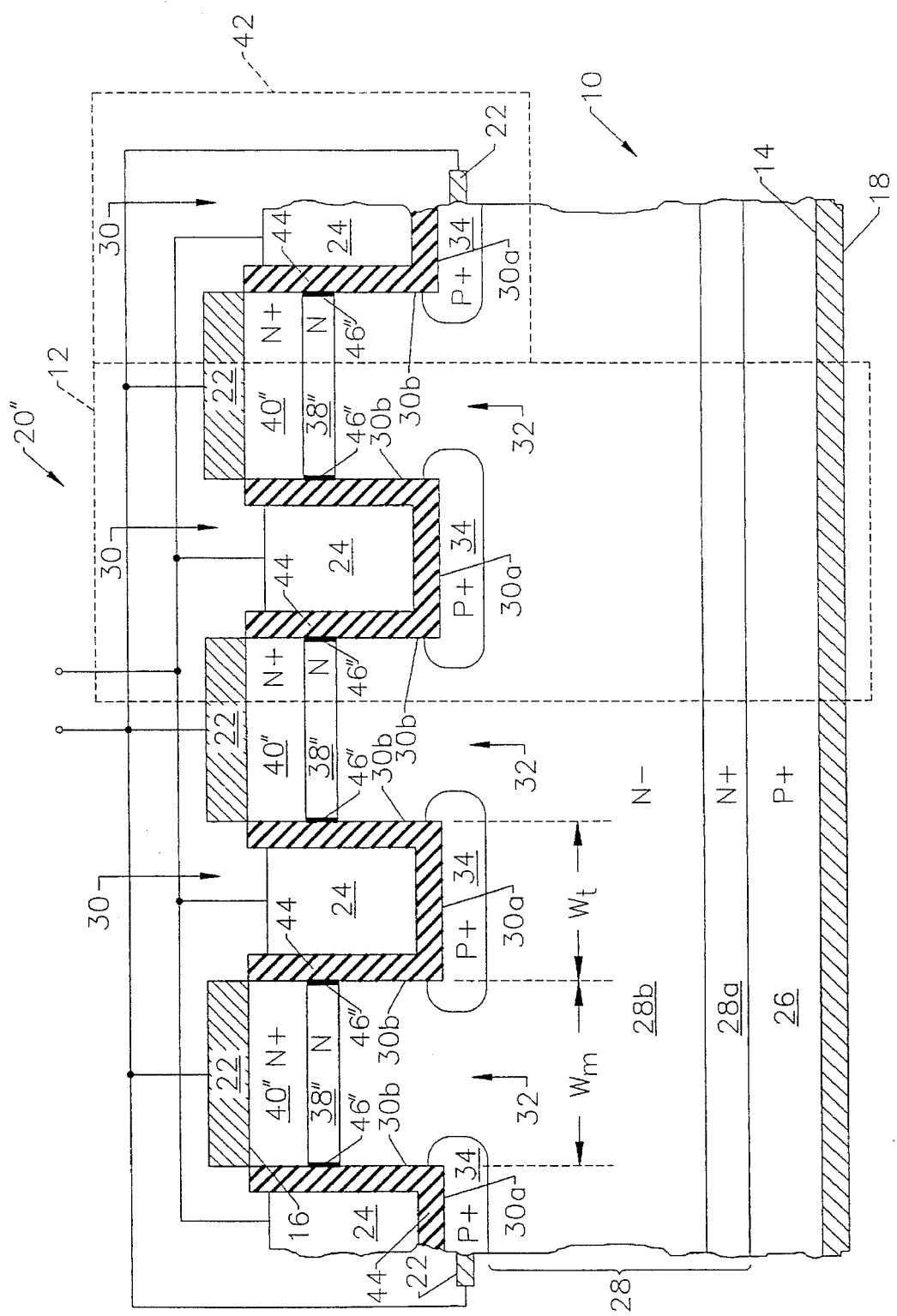
FIG. 8 is a cross-section illustration of a semiconductor switching device according to a third embodiment of the present invention.

Referring now to FIG. 8, a third embodiment of a switching device 20" according to the present invention is illustrated. The switching device 20" is similar to the switching device 20 of FIG. 6, however, the P-type second base regions 38 have been replaced with N-type accumulation channel regions 38". This eliminates the regenerative device of FIGS. 6 and 7 altogether, by eliminating a P—N—P—N path between the cathode and anode contacts. In addition, cathode regions 40" extend between the sidewalls 30b at the second face 16.

As will be understood by those skilled in the art, the regions 38" support accumulation-layer channels 46" in response to the application of a positive bias at the gate electrodes 24. Accordingly, insulated-gate transistor means 42" preferably includes vertical accumulation-mode FETs ("ACCUFETs"). As will be understood by those skilled in the art, these ACCUFETs can be made normally-off devices by properly designing the width $W_m$ of the mesas 32 so that the difference in work function potentials between the opposing gate electrodes 24 ($\psi_{gate}$) and channel regions 38" ($\psi_{channel}$) cause a complete depletion of the mesas 32, even with zero potential bias being applied to the gate electrodes 24. Accordingly, the application of a negative bias to the gate electrodes is not required to prevent conduction between the cathode region 40" and the drift region 28b. The difference in work function potential between the gate electrodes 24 and the channel regions 38" (i.e., $\psi_{gc}$) can be computed using the following equation:

$$\psi_{gc} \equiv \psi_{gate} - \left( \chi + \frac{E_g}{2q} - \psi_B \right) \quad (1)$$

where: $\chi$ is the electron affinity, $E_g$ is the bandgap, and $\psi_B$ is the potential difference between the Fermi level and intrinsic Fermi level, for silicon in the channel regions 38". $\psi_B$ is a function of the N-type doping concentration in the channel regions 38".

As will be understood by those skilled in the art, the greater the width of the mesas 32, the greater the work function difference must be to fully deplete the mesa region 32 and provide forward blocking at zero gate bias. Moreover, the application of a negative gate bias will improve the device's blocking voltage capability by extending the depletion region into the drift region 28b.

Figure 9:
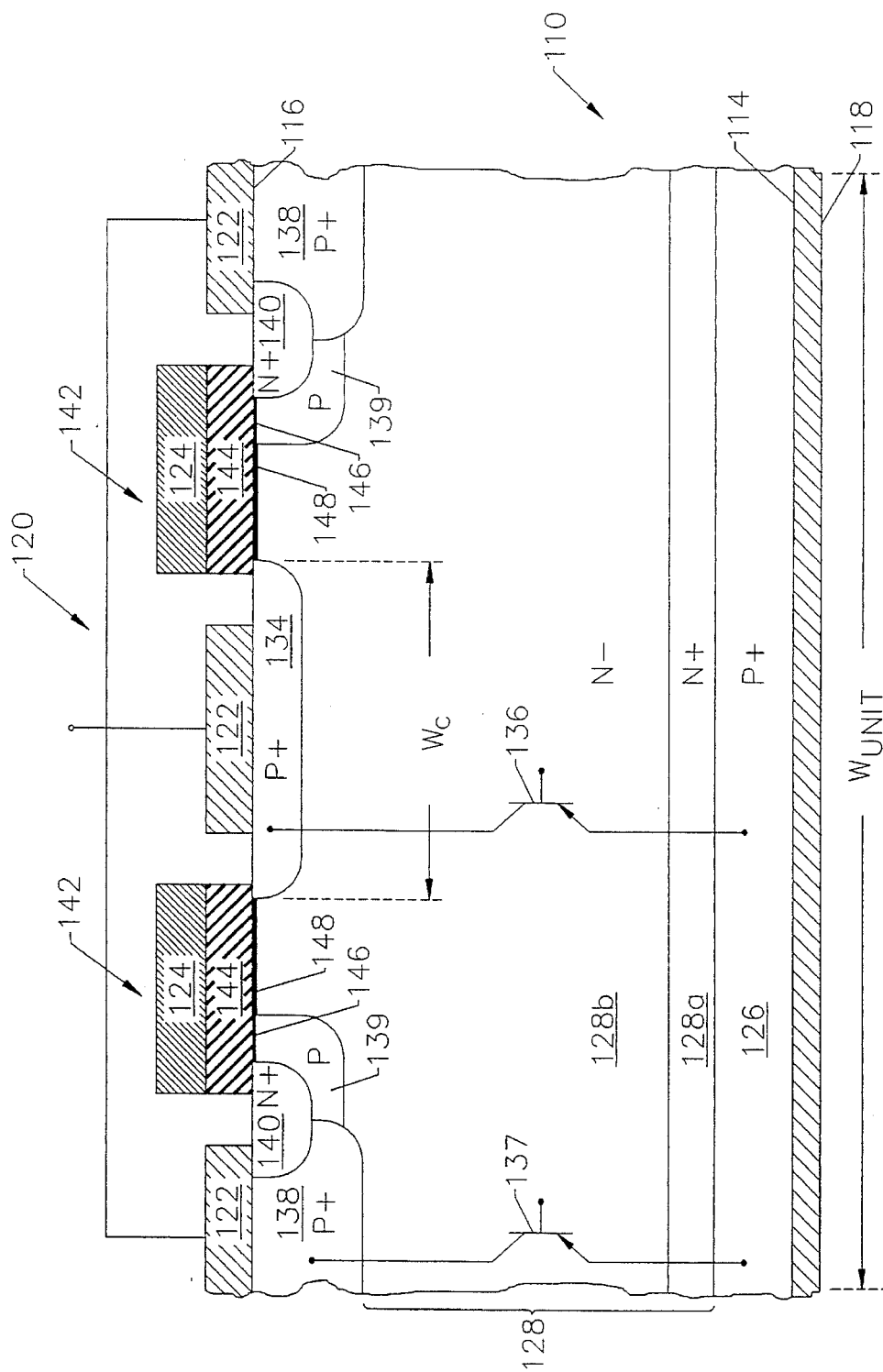
FIG. 9 is a cross-section illustration of a semiconductor switching device according to a fourth embodiment of the present invention.

Referring now to FIG. 9, a unit cell 120 of a semiconductor switching device according to a fourth embodiment of the present invention is illustrated. The unit cell 120 of width ($W_{unit}$) includes a semiconductor substrate 110 having first and second opposing faces 114 and 116, respectively, and anode and cathode contacts 118 and 122, thereon. An anode region 126 of second conductivity type is provided at the first face 114 and a first base region 128 of first conductivity type is provided on the anode region 126. The first base region 128 includes a relatively highly doped buffer region 128a, which forms a P+/N+ junction with the anode region 126, and includes a relatively lightly doped drift region 128b for supporting large anode voltages. The drift region 128b extends to the second face 116. Relatively deep P-base regions 138/139 are also provided in the first base region 128 at the second face 116. A relatively shallow collector/diverter region 134 is also provided in the first base region 128 at the second face 116. The collector/diverter region 134 also extends between adjacent P-base regions 138/139, as illustrated, and is electrically connected to the P-base regions 138 by the cathode contact 122. N-type cathode regions 140 are also provided in the P-base regions 138/139, at the second face 116. The cathode regions 140 are also electrically connected to the collector/diverter regions 134 by the cathode contact 122.

Dual-channel insulated-gate field effect transistors 142 are also provided at the second face 116. As will be understood by those skilled in the art, the application of a sufficiently positive bias to gate electrodes 124 causes the formation of N-type inversion layer channels 146 in the (second and third) P-base regions 139. These channels 146 provide a path for the flow of electrons from the N+ cathode regions 140 to the N- drift region 128b. A positive bias at the anode contact 118 also forward biases the P+/N+ junction formed by regions 126/128a, and causes the injection of holes into the drift region 128b. In response to a positive anode bias, the channels 146 also provide the electron drive current to the "floating" bases of the vertical bipolar transistors 136/137 formed by regions (126, 128 and 134) and (126, 128 and 138/139).

The holes traversing the drift region 128b are collected by the P-base regions 138/139 and flow under the N+ cathode regions 140 to the cathode contact 122. The (fourth and fifth) P-base regions 138 are also made deeper that P-bases regions 139 to increase the collector efficiency of regions 138 vis-a-vis regions 139 and thereby inhibit latch-up. At high forward current densities, the hole current in the P-base regions 139 may cause the forward biasing of the P—N junction formed between the P-base regions 139 and N-type cathode regions 140. This can activate the parasitic regenerative device (i.e., P—N—P—N thyristor) formed by regions (126, 128, 138/139 and 140). At a high enough current density, referred to as the latch-up current density, the electrons injected across this P—N junction can sustain the injection of holes across the P+/N+ junction between regions 126 and 128a. This can result in a loss of gate control by the transistors 142. To increase the latch-up current density, a collector/diverter region 134 is provided between adjacent base regions 139. In particular, the collector region 134 acts as an additional collector of holes for the parallel wide base P—N—P transistor 136.

Accordingly, because holes are also collected by the collector region 134, the total forward current density can be increased before the latch-up current density level is reached. Moreover, if latch-up of the parasitic thyristor does occur, a negative gate bias can be applied to the gate electrodes 124 to create inversion layer channels 148 at the second face 116 and turn off the latched thyristor by diverting hole current in the P-base regions 138/139 to the collector region 134. The collector/diverter region 134 also acts as a guard ring for reducing the typically high electric fields in the drift region 128b which can cause avalanche breakdown and limit the FBSOA of the device 120. It will also be understood by those skilled in the art that as the width ($W_c$) of the collector/diverter region 134 is increased relative to the pitch of the unit cell ($W_{unit}$), the latch-up current density will increase, but the forward voltage drop across the device 120 will increase as well. This same tradeoff, which is a consequence of JFET "necking" in the drift region 128b near the second face 116, also occurs if the depth of the collector/diverter region 134 is increased. Thus, the collector/diverter region 134 should be made just wide enough and deep enough to be a good collector for preventing latch-up, but not too wide or too deep since this will degrade the forward characteristics of the device 120. Preferably, the collector/diverter region 134 is made relatively shallow in comparison with the P-base regions 138/139.

In the drawings and specification, there have been disclosed typical preferred embodiments of the invention and, although specific terms are employed, they are used in a generic and descriptive sense only and not for purposes of limitation, the scope of the invention being set forth in the following claims.

That which is claimed:

1. A semiconductor switching device comprising:
   a semiconductor substrate having first and second opposing faces;
   an anode contact on the first face;
   a cathode contact of the second face;
   an anode region in said substrate, ohmically contacting said anode contact at the first face;
   a first conductivity type region in said substrate and on said anode region, opposite the first face, said first conductivity type region comprising a buffer region, which forms a first P—N junction with said anode region, and a drift region on said buffer region, said drift region having a doping concentration below that of said buffer region;
   a second conductivity type region in said substrate and on said first conductivity type region, opposite said anode region, said second conductivity type region being of same conductivity type as said anode region and forming a second P—N junction with said drift region at a position intermediate the first and second faces;
   a cathode region of first conductivity type in said substrate and ohmically contacting said cathode contact, said cathode region forming a third P—N junction with said second conductivity type region;
   a buried collector region of second conductivity type in the first conductivity type region and electrically connected to said cathode contact, said buried collector region forming a fourth P—N junction with said drift region at a position intermediate the first face and the second P—N junction; and
   means adjacent said second conductivity type region for electrically connecting said cathode region to said first conductivity type region in response to a first bias signal.

2. The semiconductor switching device of claim 1, wherein said first conductivity type region further comprises a pinch-off inhibiting region of first conductivity type in said drift region and surrounding said buried collector region, said pinch-off inhibiting having a doping concentration below that of said buffer region and above that of said drift region.

3. The semiconductor switching device of claim 1, wherein said electrical connecting means further comprises means adjacent said first conductivity type region for electrically connecting said second conductivity type region to said buried collector region in response to a second bias signal to thereby inhibit parasitic latch-up in a thyristor formed by said anode region, said first conductivity type region, said second conductivity type region and said cathode region.

4. The semiconductor switching device of claim 3, wherein said substrate further comprises first and second adjacent trenches at the second face and a mesa therebetween, and wherein said mesa includes said second conductivity type region and said cathode region.

5. The semiconductor switching device of claim 4,
   wherein said second conductivity type region extends to the second face and extends between said first and second trenches; and
   wherein said cathode region extends to the second face and extends adjacent said first trench.

6. The semiconductor switching device of claim 4, wherein said first conductivity type region further comprises a pinch-off inhibiting region, said pinch-off inhibiting region forming a P—N junction with said buried collector region and having a doping concentration above that of said drift region.

7. The semiconductor switching device of claim 6, wherein said pinch-off inhibiting region extends into said mesa.

8. A semiconductor switching device comprising:
   a semiconductor substrate having first and second opposing faces;
   an anode contact at the first face;
   a cathode contact at the second face;
   first and second adjacent trenches in the substrate at the second face;
   a non-regenerative device in said substrate, electrically connected between said cathode and anode contacts, said non-regenerative device having a second conductivity type region at a bottom of said first trench which is electrically connected to said cathode contact and a first conductivity type region which forms a P—N junction therewith and comprises a first conductivity type buffer region and a first conductivity type drift region having a doping concentration below that of said first conductivity type buffer region;
   a regenerative device in said substrate, electrically connected between said cathode and anode contacts, said regenerative device extending between said first and second trenches and having first and second conductivity type regions electrically connected to said cathode contact at the second face and wherein said second conductivity type region of said regenerative device forms a P—N junction with said first conductivity type drift region of said non-regenerative device; and insulated-gate transistor means, adjacent a sidewall of said first trench, for inhibiting electrical conduction in said regenerative device by electrically connecting said second conductivity type regions of said regenerative and said non-regenerative devices in response to a first bias signal, to thereby prevent a forward biasing of a P—N junction formed by said first and second conductivity type regions of said regenerative device.

9. The semiconductor switching device of claim 8, wherein said insulated-gate transistor means further comprises means for enabling electrical conduction in said non-regenerative device by electrically connecting said first conductivity type regions of said regenerative and non-regenerative devices in response to a second bias signal.

10. The semiconductor switching device of claim 9, wherein said regenerative device comprises a $P^+$—$N^+$—$N^-$—P—$N^+$ thyristor and said non-regenerative device comprises a $P^+$—$N^+$—$N^-$—N—$P^+$ bipolar transistor.

11. A semiconductor switching device comprising:

a semiconductor substrate having first and second opposing faces;

an anode contact on the first face;

a cathode contact on the second face;

a trench in the substrate at the second face, said trench having a trench bottom and a trench sidewall;

a bipolar transistor between said trench bottom and said anode contact, said bipolar transistor including a floating base of first conductivity type in said substrate, an emitter of second conductivity type electrically connected to said anode contact, and a collector of second conductivity type electrically connected to said cathode contact and extending adjacent the trench bottom; and means, along the trench sidewall, for electrically connecting said floating base to said cathode contact in response to a first bias signal;

wherein said floating base comprises a buffer region of first conductivity type which forms a P—N junction with said emitter region and a drift region of first conductivity type which forms a non-rectifying junction with said buffer region;

wherein said drift region has a first conductivity type doping concentration below that of said buffer region;

wherein said means for electrically connecting said floating base to said cathode contact comprises an insulated-gate transistor having a channel region of second conductivity which extends adjacent the trench sidewall; and wherein said drift region of first conductivity type forms a P—N junction with said channel region of second conductivity type.

12. The semiconductor switching device of claim 11, further comprising a pinch-off inhibiting region of first conductivity type surrounding said collector at the trench bottom and forming a P—N junction therewith, said pinch-off inhibiting region having a doping concentration greater than that of said drift region and forming a non-rectifying junction therewith.

13. A semiconductor switching device comprising:

a semiconductor substrate;

an anode region in said substrate;

a first base region adjacent said anode region and forming a first P—N junction therewith, said first base region comprising a buffer region on said anode region and a drift region, having a doping concentration below that of said buffer region, on said buffer region;

a second base region adjacent said first base region and forming a P—N junction with said drift region;

a cathode region in said second base region;

a cathode contact on said cathode region;

a trench in said substrate, said trench having a trench bottom and first and second opposing trench sidewalls, said first trench sidewall extending adjacent said cathode region, said second base region and said drift region;

a buried collector region of opposite conductivity type than said first base region in said substrate, said buried collector region being electrically connected to said cathode contact and extending adjacent the bottom of said trench;

an electrically insulating region in said trench, said electrically insulating region extending adjacent the first and second opposing trench sidewalls and across the trench bottom, from the first trench sidewall to the second trench sidewall so that the first trench sidewall defines an interface between said electrically insulating region and said cathode region, said second base region and said drift region; and a conductive gate electrode on said insulating region, opposite the first trench sidewall.

14. The semiconductor switching device of claim 13, wherein the first trench sidewall also defines an interface between said electrically insulating region and said buried collector region.

15. The semiconductor switching device of claim 14, further comprising a pinch-off inhibiting region of first conductivity type which forms a P—N junction with said buried collector region, said pinch-off inhibiting region having a doping concentration greater than that of said drift region, and wherein the first trench sidewall also defines an interface between said electrically insulating region and said pinch-off inhibiting region.

16. A semiconductor switching device comprising:

an anode region;

a first base region of first conductivity type on said anode region and forming a first P—N junction therewith, said first base region comprising a buffer region on said anode region and a drift region on said buffer region, opposite said anode region, said drift region having a first conductivity type doping concentration below that of said buffer region;

a second base region of second conductivity type on said first base region and forming a second P—N junction with said drift region;

an anode contact and a cathode contact ohmically contacting said anode region and said second base region, respectively;

a cathode region of first conductivity type in said second base region, ohmically contacting said cathode contact and forming a third P—N junction with said second base region;

a buried collector region in said first base region, between said second base region and said anode region, said buried collector region ohmically contacting said cathode contact; and a dual-channel vertical MOSFET extending between said buried collector region and said cathode region, said dual-channel MOSFET having first and second channel regions in said drift region and said second base region, respectively, and wherein the application of a first gate bias to said dual-channel MOSFET electrically connects said cathode region to said first base region and turns on a bipolar junction transistor formed by said anode region, said first base region and said buried collector region when said anode region is biased to a first polarity relative to said cathode contact; and wherein the application of a second gate bias to said dual-channel MOSFET electrically connects said second base region to said buried collector region and inhibits parasitic latch-up of a thyristor formed by said anode region, said first base region, said second base region and said cathode region by inhibiting a forward biasing of the third P—N junction.

17. The semiconductor switching device of claim 16, further comprising a trench extending into said second base region and said first base region, said trench having a bottom adjacent said buried collector region and a sidewall adjacent said first and second base regions.

18. The semiconductor switching device of claim 17, wherein said dual-channel vertical MOSFET has a conductive gate electrode in said trench and a gate insulating layer adjacent the trench sidewall.

19. The semiconductor switching device of claim 17, further comprising a pinch-off inhibiting region of first conductivity type in said drift region, said pinch-off inhibiting region forming a P—N junction with said buried collector region and having a doping concentration above that of said drift region.

* * * * *